United States Patent [19]

Tsujioka et al.

[11] Patent Number: 5,574,959
[45] Date of Patent: Nov. 12, 1996

[54] METAL CASING FOR SEMICONDUCTOR DEVICE HAVING HIGH THERMAL CONDUCTIVITY AND THERMAL EXPANSION COEFFICIENT

[75] Inventors: Masanori Tsujioka; Junzoh Matsumura, both of Hyogo, Japan

[73] Assignee: Sumitomo Electric Industries, Ltd., Osaka, Japan

[21] Appl. No.: 306,955

[22] Filed: Sep. 16, 1994

[30] Foreign Application Priority Data

Sep. 16, 1993 [JP] Japan .................................. 5-253818

[51] Int. Cl.⁶ ..................................................... B22F 3/16
[52] U.S. Cl. ................................... 419/2; 419/5; 419/23; 419/27; 419/30; 419/36; 419/37; 419/38; 419/65
[58] Field of Search .......................... 419/2, 5, 23, 27, 419/30, 36, 37, 38, 65

[56] References Cited

U.S. PATENT DOCUMENTS

| | | | |
|---|---|---|---|
| 3,929,476 | 12/1975 | Kirby, Jr. et al. | 75/214 |
| 4,327,156 | 4/1982 | Dillon et al. | 428/568 |
| 4,373,127 | 2/1983 | Haskett et al. | 219/69 E |
| 4,431,449 | 2/1984 | Dillon et al. | 75/246 |
| 4,491,558 | 1/1985 | Gardner | 419/23 |
| 4,554,218 | 11/1985 | Gardner et al. | 428/567 |
| 4,710,223 | 12/1987 | Matejczyk | 75/248 |
| 5,017,526 | 5/1991 | Newkirk et al. | 501/89 |
| 5,086,333 | 2/1992 | Osada et al. | 357/67 |
| 5,099,310 | 3/1992 | Osada et al. | 357/81 |
| 5,167,697 | 12/1992 | Koumura et al. | 75/247 |

FOREIGN PATENT DOCUMENTS

| | | |
|---|---|---|
| 0100232 | 2/1984 | European Pat. Off. . |
| 89/02803 | 4/1989 | WIPO . |

OTHER PUBLICATIONS

Patent Abstracts of Japan, vol. 8, No. 272 (E-284), Dec. 13, 1984.

*Primary Examiner*—Charles T. Jordan
*Assistant Examiner*—Daniel Jenkins
*Attorney, Agent, or Firm*—Foley & Lardner

[57] ABSTRACT

A metal casing for a semiconductor device is manufactured by a powder metallurgy injection molding process which uses infiltration. The metal casing includes a base member and an enclosure member arranged on the base member. The base member and the enclosure member are formed of an alloy including 20 to 50 percent by volume of copper, equal to or less than 1 percent by weight of nickel and remainder of tungsten or molybdenum. The metal casing is manufactured as a net-shape product by a process which includes the steps of mixing tungsten powder and nickel powder having average particles sizes equal to or less than 40 μm so as to form mixed metal powder, kneading the mixed metal powder with an organic binder so as to form an admixture, injection molding said admixture so as to form a predetermined green shape, debinderizing said green shape, applying surface powder to at least one surface of the green shape so as to prevent effusion of copper during infiltration and infiltrating copper into the green shape so as to produce a net-shape product.

10 Claims, 4 Drawing Sheets

5,574,959

METAL CASING FOR SEMICONDUCTOR DEVICE HAVING HIGH THERMAL CONDUCTIVITY AND THERMAL EXPANSION COEFFICIENT

BACKGROUND OF THE INVENTION

1. Field of the Invention

The present invention relates to a metal casing for a semiconductor device and method for manufacturing it, and more specifically to a metal casing suitable for a semiconductor device such as a photodiode, a laser diode, a microwave device for microwave communication, and a high power supply which has high thermal conductivity, high heat spreading and thermal expansion coefficient similar to those of a semiconductor, a ceramic or glass element disposed on the metal casing, and method for manufacturing the metal casing at low cost.

2. Description of Related Art

A metal casing for a high power supply and a semiconductor device used for optical communication or microwave communication generally comprises a base member on which the semiconductor device is mounted and an enclosure member which is fixed on the base member and which surrounds the semiconductor device and on which terminal pins for wiring are fixed by some particular ways. For example, terminal pins are mounted on ceramic mounting members and the ceramic mounting members are fixed to the enclosure member of the metal casing. In another case, terminal pins are fixed to holes of the enclosure member by using sealing glass.

In case of a metal casing for a semiconductor device for optical communication, the enclosure member comprises an opening for transmitting or receiving optical signals. Glass is usually fitted to the opening. An optical fiber is arranged near the outside of the opening.

In addition, a metal frame may be disposed on an upper edge of the enclosure member in order to fix a sealing cap.

The metal casing is heated while the semiconductor device mounted in it functions. As mentioned above, since the ceramic members and the glass part are fixed on the enclosure member, the enclosure member is preferably formed of a material having a thermal expansion coefficient similar to those of the ceramic members and the glass part. In addition, the enclosure member generally has a complicated shape, its material is required to have good machinability. Furthermore, the enclosure member should have certain rigidity.

In order to fulfill the above requirements, an enclosure member of a conventional metal casing is often formed of an iron-nickel alloy or an iron-nickel-cobalt alloy. On the contrary, a base member of the conventional metal casing is formed of a metal or an alloy having a good thermal conductivity and heat spreading such as copper or a copper-tungsten alloy in order to radiate heat generated by a semiconductor device mounted on it.

In the conventional metal casing, the enclosure member is jointed to the base member by brazing utilizing a silver-copper solder. However, since the enclosure member and the base member are formed of different metals or alloys, the conventional metal casing is liable to distort during the brazing. In particular warping of the base member is often caused.

If a semiconductor device for optical communication such as a laser diode or a photodiode is mounted in the distorted metal casing an optical coupling of the semiconductor device often deviates from that of an optical fiber so that a substantial optical power is decreased.

If a microwave semiconductor device is mounted in the distorted metal casing, the semiconductor device may be sometimes damaged or instability of a ground voltage and drop of heat radiation are caused so that the device becomes out of order.

In order to resolve the above problems, the base member of the metal casing is sometimes ground after the brazing so as to correct the warping. However, this work is of poor efficiency.

It can be considered that the metal casing is integrally formed of a base member and an enclosure member of an equal material in one-piece. In this case, the metal casing has been formed of a copper-tungsten alloy having a thermal expansion coefficient similar to those of some ceramic and glass materials, good thermal conductivity and heat spreading. However, in order to manufacture the metal casing integrally formed of the copper-tungsten alloy, it should be machined from a copper-tungsten alloy block. This results high cost and hard to conduct mass production.

The metal casing for a semiconductor device of a copper-tungsten alloy or a copper-polybdenum alloy is preferably manufactured by using powder metallurgical techniques such as one disclosed in Japanese Patent Application Laid-open No. 59-21032, in particular by sintering and infiltration. A metal injection molding process which is an improved sintering process is disclosed in International Patent Publication WO89/02803. In the metal injection molding process, copper powder and tungsten powder are mixed with an organic binder material to form an admixture. The admixture is molded by injection molding to form a predetermined green shape. The green shape is debinderized and sintered to produce a product.

However, the green shape should contract in volume equivalent to that of the binder included in it during the sintering so as to obtain a required density and thermal conductivity. In case of a product having a complicated shape such as a metal casing for a semiconductor device, the contraction does not uniformly occur, which is liable to cause distortion of the product so that it is difficult to obtained a high accuracy in shape.

In addition, the green shape includes 5 to 50 wt % copper powder, which melts and effuses to form a copper layer on a surface of the product so as to form a effused zone. The effused zone also spoils accuracies in shape and size. Therefore, the metal casing for a semiconductor device should be machined after the sintering in accordance the above prior art.

SUMMARY OF THE INVENTION

Accordingly, it is an object of the present invention to provide a metal casing for a semiconductor device formed of a copper-tungsten alloy or a copper-molybdenum alloy having high thermal conductivity, high heat spreading and thermal expansion coefficient similar to those of a semiconductor, a ceramic or glass element disposed on the metal casing which has overcome the above mentioned defect of the conventional one.

Another object of the present invention is to provide a method for manufacturing the metal casing formed of a copper-tungsten alloy or a copper-molybdenum alloy at low cost.

The above and other objects of the present invention are achieved in accordance with the present invention by a metal casing for a semiconductor device comprising a base member and an enclosure member arranged on the base member wherein the base member and the enclosure member are formed of an alloy including 20 to 50 percent by volume of copper, equal to or less than 1 percent by weight of nickel and remainder of tungsten.

The alloy of the metal casing in accordance with the present invention is preferably formed of a metal composite which has a tungsten-nickel admixture skeleton and copper infiltration filler.

According to another aspect of the present invention, there is provided a powder metallurgy injection molding process using infiltration to manufacture net-shape products comprising the steps of mixing tungsten powder and nickel powder having average particle sizes equal to or less than 40 μm so as to form mixed metal powder, kneading the mixed metal powder with an organic binder so as to form an admixture, injection molding said admixture so as to form a predetermined green shape, debinderizing said green shape and infiltrating copper into the green shape so as to produce a net-shape product.

The above and other objects, features and advantages of the present invention will be apparent from the following description of preferred embodiments of the invention with reference to the accompanying drawings.

DESCRIPTION OF THE PREFERRED EMBODIMENTS

EMBODIMENT 1

Figure 1A:
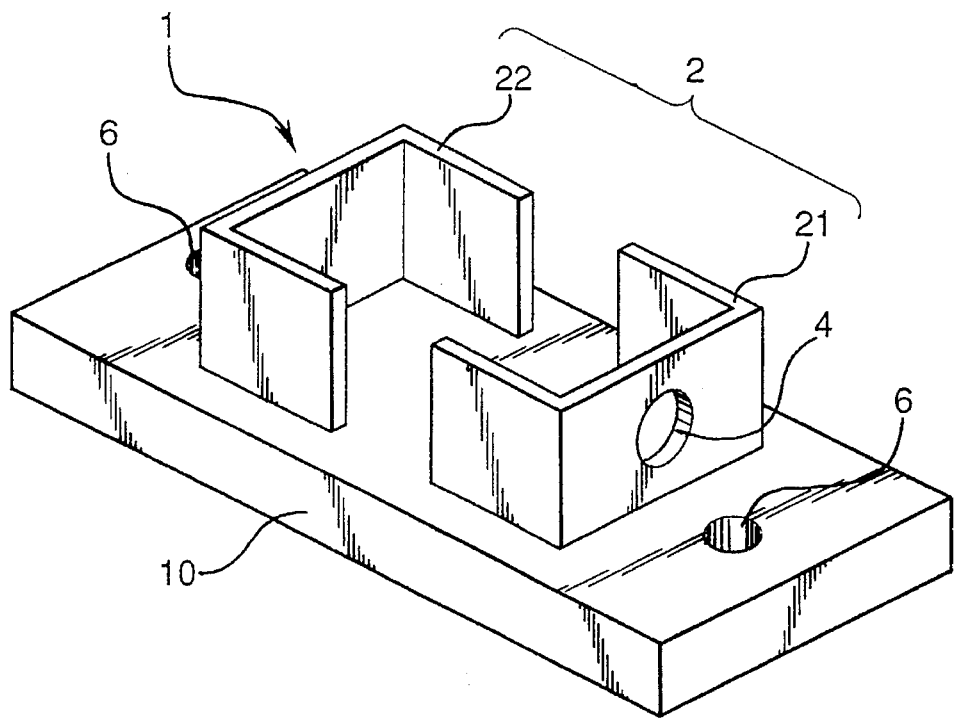
FIG. 1A is a perspective view of a metal case for a laser diode module in accordance with the present invention.
Figure 1B:
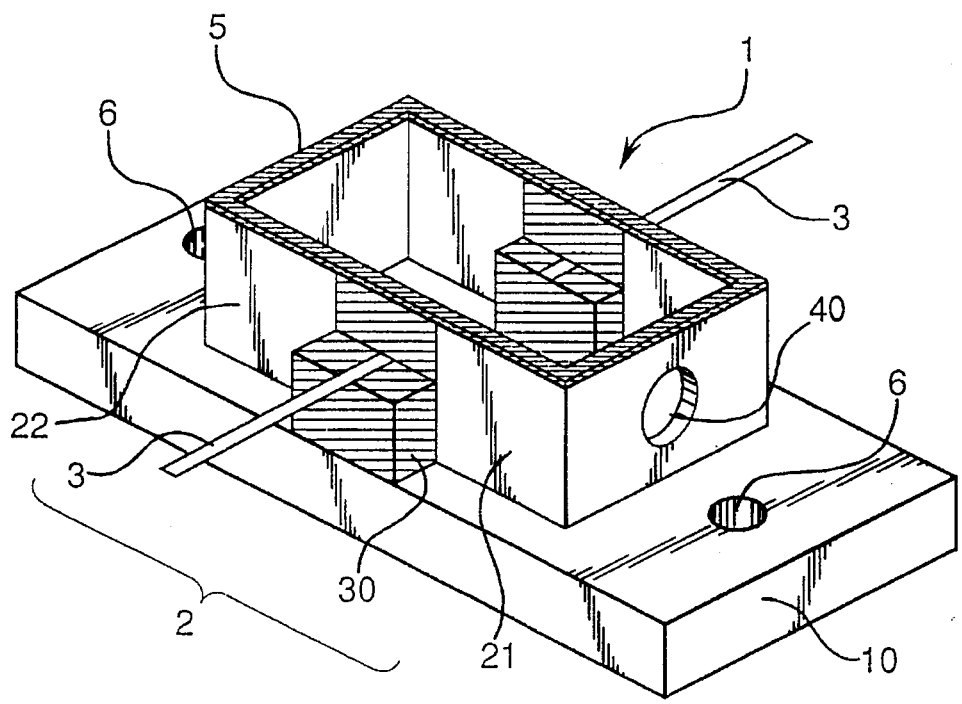
FIG. 1B is a perspective view of the metal case of FIG. 1A to which elements are assembled.

Referring to FIGS. 1A and 1B, a first embodiment of the metal casing for a semiconductor device in accordance with the present invention will be explained. In FIG. 1A, there is shown a metal case for a laser diode module for optical communication which is one embodiment of the metal casing in accordance with the present invention.

The metal case shown in FIG. 1A comprises a base member 10 and an enclosure member 2 integrally formed of an alloy including copper, tungsten and nickel. The enclosure member 2 is composed of a front member 21 and a rear member 22 separately arranged on the base member 10. The front member 21 comprises an opening 4 for an window through which optical signals pass. The base member 10 comprises holes 6 for screw fixing before and after the enclosure member 2. The metal case is produced in net-shape so that no machinery is necessary.

FIG. 1B shows the metal case of FIG. 1A to which some elements and parts are assembled. In FIG. 1B, terminals 3 mounted on ceramic members 30 are inserted and hermetically fixed in gaps between the front member 21 and the rear member 22. A frame 5 is disposed on an upper edge of the enclosure member 2 which contributes fastening of the ceramic members 30 and a cap (not shown). In addition, glass 40 is hermetically fitted to the opening 4.

According to the present invention, the metal case is formed of an alloy including copper, nickel and tungsten or an alloy including copper, nickel and molybdenum or an alloy including copper, nickel, tungsten and molybdenum having high thermal conductivity and a thermal expansion coefficient similar to the ceramic and glass. The alloy has a content of 20 to 50 percent by volume of copper and equal to or less than 1 percent by weight of nickel and the remainder is tungsten and/or molybdenum. A ratio between tungsten and molybdenum can be arbitrarily selected.

If the copper content of the alloy is less than 20 percent by volume, inner pores are prone to be formed so that the alloy is hard to be packed. The alloy having such a composite does not have stable characteristics, in particular its thermal conductivity is unstable so that it is not suitable for the metal case.

If the copper content of the alloy excesses 50 percent by volume, the thermal expansion coefficient of the alloy becomes larger than $10 \times 10^{-6}/°C.$, so that difference in thermal expansion coefficient between the alloy and the ceramic and glass materials becomes too large.

The nickel of small content of equal to or less than 1 percent by weight give a preferable effect during the process for preparing the metal case so that the characteristics of the metal case is improved. However, if the nickel content of the alloy excesses 1 percent by weight, the thermal conductivity of the alloy becomes lower, which is not preferable.

The metal case shown in FIG. 1A was manufactured by the following process. At first, tungsten powder having an average particle diameter of 3 μm and nickel powder having an average particle diameter of 4 μm were admixed with a ratio of 99.9 to 0.1 by weight.

Molybdenum powder, a mixture of tungsten powder and molybdenum powder and a tungsten-molybdenum alloy powder can be used instead of the tungsten powder. The average particle diameters of the metal powders are preferably equal to or smaller than 40 μm. If the average particle diameters are larger than 40 μm, products will be too brittle.

Then, an organic binder of 75 parts by volume of wax having a melting point of 80° C. and 25 parts by volume of polyethylene having a decomposition temperature of 550° C. was prepared.

The wax preferably have a melting point equal to or lower than 100° C. The organic binder is preferably composed of the wax and an organic material which hardly leaves ash.

The mixed metal powder of the tungsten powder and nickel powder and the organic binder were mixed with a ratio of 38 to 62 by volume and kneaded. The kneaded admixture was injection molded so as to form a green shape of the metal case.

The ratio between the mixed metal powder and the organic binder are determined so that the green shape will have porosities of 20 to 50 percent by volume after it is debinderized.

The green shape was debinderized by a two-stage treatment. At first, the green shape was debinderized by vapor of methylene chloride (boiling point: 40° C.) for 5 hours. Then, the green shape was debinderized by heating to 800° C. for 30 minutes in hydrogen gas.

After the two-stage treatment, the green shape had a good appearance and there was no distortion and warping so that a configuration of each part was maintained. A porosity rate of the green shape was 38 percent by volume.

According to the present invention, an organic binder composed of a wax having a low melting point and a organic material which hardly leaves ash is used. The organic material is stable at the melting point of the wax. At the first stage of the debinderization process, the green shape is debinderized by vapor of an organic solvent, which removes the wax and debinderizes surfaces of the green shape and forms guide porosities. At the second stage of the debinderization process, the green shape is heated so as to vaporize the organic material so that the green shape is completely debinderized.

The organic solvent preferably has a boiling point lower than a melting point or a softening point of the organic material to avoid distortion of the green shape during the vaporization of the binder. The organic solvent is preferably selected from ethanol, acetone, trichlorothane, carbon tetrachloride, methylene chloride, etc.

According to the present invention, the heat treatment is preferably conducted under an atmosphere which does not include oxygen, for example, hydrogen atmosphere in order to oxidize the green shape.

The porosity rate of the green shape should be 20 to 50 percent by volume. If it is smaller than 20 percent by volume, a copper content of the products will be lower than 20 percent by volume. If the porosity rate is larger than 50 percent by volume, a copper content of the products will be higher than 50 percent by volume so that thermal expansion coefficients of the products become higher than $10 \times 10^{-6}/°C$.

Thereafter, boron nitride powder dispersed in water was sprayed to all the surface of the green shape excluding the back to a thickness of 10 μm. The boron nitride powder prevented effusion of copper in the successive process.

The powder for preventing copper effusion should be formed of a material or materials which is not wetted by molten copper, is physically and chemically stable at the infiltration so that it does not react with the porous green shape and is easily removed after the infiltration. For example, the material of the powder can be one or ones selected from carbides, nitrides and oxides, in particular, $Al_2O_3$, $TiO_2$, $SiO_2$, $ZrO_2$, AlN, BN, $Si_3N_4$, TiN, ZrN, SiC, ZrC and TiC. Powders of other materials could not prevent the effusion of copper adequately or were too hard to remove after the process.

The green shape was placed on a copper plate having sides equal to the base member and a thickness of 1 mm, so that copper was infiltrated into the green shape in a continuous furnace under hydrogen atmosphere at a temperature of 1150° C. During the infiltration, the boron nitride powder prevents effusion of molten copper.

After the infiltration, the boron nitride powder was removed by liquid honing and residual molten copper was removed by plane grinding, so that the metal case in accordance with the present invention was completed.

The metal case was formed of a specified metal tissue composite having a tungsten-nickel admixture skeleton and copper infiltration filler. No copper effusion occurred on the surfaces of the metal case on which the effusion preventive boron nitride powder had been applied. After the infiltration, the dimensions of the product contracted at a rate of 0.8 percent.

In the above process according to the present invention, copper is infiltrated into the porosities of the green shape, which are formed by debinderizing. Therefore, the green shape does not contract so as to obtain high accuracy of shape and dimension. In addition, a high enough density of the products can also be obtained.

There are shown particulars of the metal cases manufactured by the above method in accordance with the present invention in the following Tables 1—1 and 1–2.

TABLE 1-1

| | Ratio of W/Ni or Mo/Ni (by weight) | Ratio of Binder/ Metal powder (by volume) | Debinderizing | | Porosity of porous green shape (% by volume) |
|---|---|---|---|---|---|
| | | | Solvent* used in 1st Stage | Temperature of heat treatment in 2nd stage (°C.) | |
| 1 | 99.9/0.1 | 38/62 | MC | 800 | 20 |
| 2 | 99.0/1.0 | 20/80 | ET | 800 | 20 |
| 3 | 99.5/0.5 | 20/80 | MC | 800 | 20 |
| 4 | 99.6/0.4 | 28/72 | ET | 600 | 28 |
| 5 | 99.6/0.4 | 28/72 | ET | 600 | 28 |
| 6 | 99.7/0.3 | 35/65 | MC | 600 | 35 |
| 7 | 99.7/0.3 | 35/65 | MC | 550 | 35 |
| 8 | 99.8/0.2 | 42/58 | ET | 550 | 42 |
| 9 | 99.8/0.2 | 42/58 | ET | 600 | 42 |
| 10 | 99.9/0.1 | 48/52 | MC | 600 | 48 |
| 11 | 99.0/1.0 | 20/80 | ET | 800 | 20 |
| 12 | 99.5/0.5 | 35/65 | ET | 600 | 35 |
| 13 | 99.9/0.1 | 49/51 | MC | 600 | 49 |
| 14 | 99.5/0.5 | 18/82 | — | — | — |
| 15 | 99.5/0.5 | 51/49 | — | — | — |
| 16 | 98.8/1.2 | 28/72 | ET | 600 | 28 |

Remarks:
*ET means ethanol
MC means methylene chloride.

TABLE 1-2

| | Effusion preventive material | Density of alloy | Rate of Contraction |
|---|---|---|---|
| 1 | BN | 15.3 ± 0.2 | 0.8 |
| 2 | ZrO$_2$ | 17.2 ± 0.3 | 0 |
| 3 | BN | 17.2 ± 0.3 | 0 |
| 4 | TiN | 16.4 ± 0.3 | 0 |
| 5 | Al$_2$O$_3$ | 16.4 ± 0.3 | 0 |
| 6 | BN | 15.7 ± 0.2 | 0.5 |
| 7 | BN | 15.6 ± 0.2 | 0.5 |
| 8 | TiN | 14.9 ± 0.2 | 1.0 |
| 9 | TiN | 14.9 ± 0.2 | 1.0 |
| 10 | AlN | 14.3 ± 0.2 | 1.8 |
| 11 | BN | 9.9 ± 0.2 | 0 |
| 12 | TiN | 9.8 ± 0.2 | 0.2 |
| 13 | AlN | 9.6 ± 0.2 | 1.5 |
| 14 | — | — | — |
| 15 | — | — | — |
| 16 | Al$_2$O$_3$ | 6.4 ± 0.3 | 0 |

In the above Tables 1—1 and 1-2, Sample Nos. 1 to 10 are present invention using W-Ni powder. Sample Nos. 11 to 113 are present invention using Mo-Ni powder. Sample Nos. 14, the mold was completely filled with the admixture so that a shape of required density could not be obtained. In sample 15, the green shape foamed during the debinderization so that a required porous green shape could not be obtained.

As shown in Tables 1—1 and 1-2, the densities of alloys of the metal cases in accordance with the present invention were almost equal to theoretical values. By this, it became clear that copper had been almost completely infiltrated into porosities of the green shape. In addition, no defect was found in cross sections of the metal cases.

Sample No. 10 had the largest contraction rate of 1.8 percent. The contraction occurred during the infiltration and the rate of the contraction was determined by the rate of porosities of the porous green shape. If the rate of porosities of the porous green shape was equal to or less than 30 percent by volume, the contraction hardly occurred. If the rate of porosities of the porous green shape excessed 30 percent by volume, the contraction occurred corresponding to the rate of porosities. However, according to the present invention, the contraction rate was at most 2 percent. In addition, this small contraction had no effect on the characteristics of the alloy and on accuracy of the size.

Thermal conductivities and thermal expansion coefficients of the alloys of the above metal cases were shown in the following Table 2:

TABLE 2

| Sample | Thermal expansion coefficient (×10$^{-6}$/°C.) | Thermal conductivity (cal/cm · sec. · °C.) |
|---|---|---|
| 1 | 8.6 | 0.51 |
| 2 | 6.5 | 0.39 |
| 3 | 6.5 | 0.42 |
| 4 | 7.2 | 0.45 |
| 5 | 7.2 | 0.45 |
| 6 | 8.3 | 0.48 |
| 7 | 8.3 | 0.48 |
| 8 | 9.1 | 0.55 |
| 9 | 9.1 | 0.55 |
| 10 | 9.7 | 0.63 |
| 11 | 8.0 | 0.38 |
| 12 | 9.0 | 0.49 |
| 13 | 10.0 | 0.57 |
| 16 | 7.2 | 0.30 |

The thermal conductivities and the thermal expansion coefficients of the alloys shown in Table 2 are suitable for metal casings for semiconductor devices.

Accuracy of dimensions of the metal cases of Sample 6 of Tables 1 and 2 and ones manufactured by a conventional method disclosed in International Patent Publication WO89/02803 having the same copper composition (Comparative Example 1) are shown in the following Tables 3-1 and 3-2.

TABLE 3-1

| | Base member | | | | |
|---|---|---|---|---|---|
| Required value | Length 32 ± 0.15 | Width 12.7 ± 0.1 | Thickness 1.0 ± 0.05 | Diameter of holes 2.64 ± 0.05 | Warping 0.015 Max |
| Sample | | | | | |
| 6-1 | 31.96 | 12.71 | 1.01 | 2.64 | 0.005 |
| 6-2 | 31.96 | 12.72 | 1.01 | 2.63 | 0.003 |
| 6-3 | 32.01 | 12.69 | 1.02 | 2.66 | 0.005 |
| 6-4 | 32.05 | 12.70 | 0.99 | 2.65 | 0.001 |
| 6-5 | 32.02 | 12.68 | 0.98 | 2.62 | 0.003 |
| 6-6 | 32.03 | 12.68 | 1.00 | 2.65 | 0.005 |
| 6-7 | 31.98 | 12.70 | 1.00 | 2.66 | 0.004 |
| 6-8 | 31.99 | 12.73 | 1.02 | 2.64 | 0.004 |
| 6-9 | 32.00 | 12.71 | 0.98 | 2.62 | 0.003 |
| 6-10 | 32.01 | 12.70 | 1.00 | 2.64 | 0.002 |
| Average | 32.001 | 12.702 | 1.001 | 2.641 | 0.004 |
| R | 0.090 | 0.050 | 0.040 | 0.040 | 0.004 |
| δ | 0.028 | 0.015 | 0.014 | 0.014 | 0.001 |
| Comparative Example 1 | | | | | |
| Average | 32.010 | 12.69 | 1.00 | 2.65 | 0.012 |
| R | 0.12 | 0.08 | 0.05 | 0.05 | 0.08 |

TABLE 3-1-continued

| | Base member | | | | |
|---|---|---|---|---|---|
| Required value | Length 32 ± 0.15 | Width 12.7 ± 0.1 | Thickness 1.0 ± 0.05 | Diameter of holes 2.64 ± 0.05 | Warping 0.015 Max |
| δ Comparative Example 2 | 0.049 | 0.034 | 0.026 | 0.025 | 0.030 |
| Average | | | | | 0.032 |
| R | | | | | 0.017 |
| δ | | | | | 0.048 |

TABLE 3-2

| | Enclosure member | | |
|---|---|---|---|
| Required value | Length 20.80 ± 0.15 | Width 12.7 ± 0.1 | Thickness 8.0 ± 0.1 |
| Sample | | | |
| 6-1 | 20.80 | 12.71 | 8.03 |
| 6-2 | 20.79 | 12.72 | 8.02 |
| 6-3 | 20.76 | 12.69 | 7.99 |
| 6-4 | 20.83 | 12.70 | 8.01 |
| 6-5 | 20.85 | 12.68 | 7.97 |
| 6-6 | 20.81 | 12.68 | 8.01 |
| 6-7 | 20.82 | 12.70 | 8.00 |
| 6-8 | 20.84 | 12.73 | 7.96 |
| 6-9 | 20.81 | 12.71 | 7.99 |
| 6-10 | 20.80 | 12.70 | 8.02 |
| Average | 20.811 | 12.702 | 8.000 |
| R | 0.090 | 0.050 | 0.070 |
| δ | 0.025 | 0.015 | 0.021 |
| Comparative Example 1 | | | |
| Average | 20.81 | 12.69 | 7.99 |
| R | 0.11 | 0.08 | 0.04 |
| δ | 0.043 | 0.034 | 0.026 |

Remarks:
Comparative Example 2 was manufactured by a conventional method disclosed in Japanese Patent Application Laid-open No. 59-21032, in which base members were machined from copper-tungsten alloy and enclosure members of a iron-nickel-cobalt alloy were brazed on the base members.
R: range
δ: standard deviation Then, ceramic members 30 of terminals and frame members 5 were brazed so that metal case assemblies shown in FIG. 1B were prepared by using the metal cases according to the present invention, and the metal cases of the Comparative example 1 and 2. Each of the metal case assemblies was nickel plated to a deposit thickness of 1.5 μm and further gold plated to a deposit thickness of 1.5 μm. Sapphire members were hermetically soldered to the openings 4 by using gold-tin solder.

Heat-resistance and gastightness after 100 heat cycles (−65° C.×10 min. ←→ +150° C.×10 min.) were respectively evaluated for each 200 metal cases. The heat-resistance was evaluated by observing surfaces of the metal cases by using a optical microscope at a magnification of ×20 so as to find blisters, stains and change in color after heating the metal cases to 450° C. for 5 minutes under the air.

Figure 4:
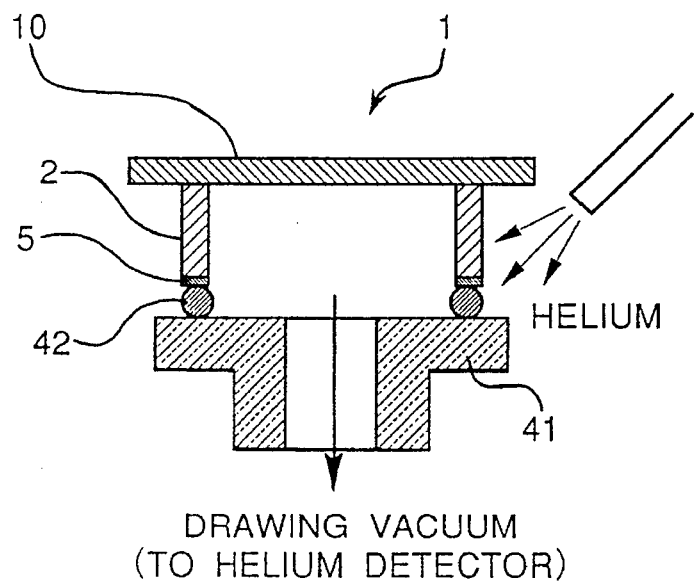
FIG. 4 is a schematic sectional view illustrating the sealing test carried out in the Embodiment.
Figure 5:
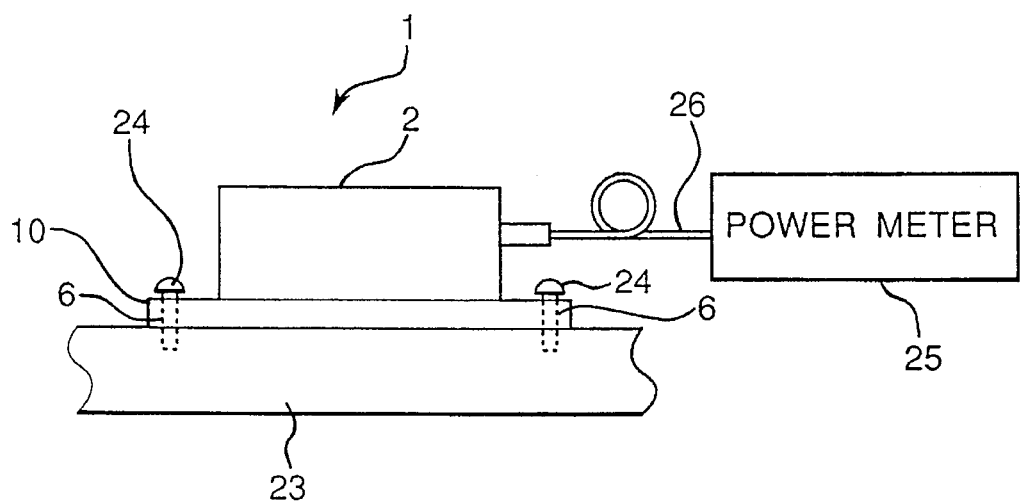
FIG. 5 is a schematic side view illustrating the method for measuring laser power.

Referring to FIG. 4, the gastightness test will be explained. The metal case assembly was disposed on a flange 41 through an O-ling 42 so as to be evacuated. Then, helium gas was jetted to the metal case so that leak rate of the helium gas was measured through the flange by helium detector. Metal cases having a leak rate of higher than $5\times10^{-8}$ atm.cm$^3$/sec. were determined to be detective products. The results were shown in the following Table 4.

TABLE 4

| | Invention (200 each) | Comparative Example 1 (200 each) | Comparative Example 2 (200 each) |
|---|---|---|---|
| Heat-resistance of deposit (number of defective products) (side surface of Enclosure) | 0 | 4 | 0 |
| Gastightness after heat cycles (number of defective products) | 0 | 2 | 0 |
| Gastightness after thermal shock (number of defective products) | 0 | 2 | 0 |

As shown in Table 4, there were defective products in the samples of the comparative example 1. However, there were no defective products in samples according to the present invention. The metal cases according to the present invention had a leak rate of less than $1\times10^{-9}$ atm.cm$^3$/sec. The poor gastightness of the samples of the comparative example 1 was considered to be caused by porosities of the metal case assemblies of the comparative example 1.

Laser diodes were mounted to the metal case assemblies and the metal case assemblies were fixed on heat spreaders 23 of copper by using bolts 24. The laser diodes were optically connected to power meters 25 by optical fibers 26 so that optical power was measured. The optical power of each was measured before ($W_1$) and after ($W_2$) tightening the bolts 24 so that a rate of power drop of $(W_1-W_2)/W_1$ was calculated. The results are shown in Table 5.

TABLE 5

| | Invention | Comparative Example 1 | Comparative Example 2 |
|---|---|---|---|
| Power drop rate | less than 1% | 1 to 7% | 1 to 10% |

As shown in Table 5, the metal cases of comparative examples 1 and 2 had larger distortions and warpings than that of the present invention so that optical couplings deviated so as to lower optical power.

EMBODIMENT 2

Figure 2A:
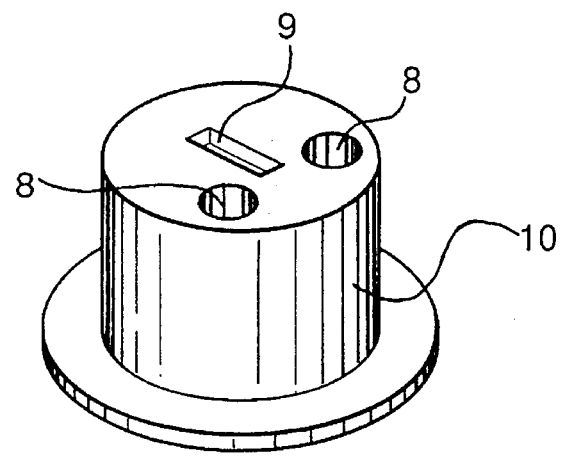
FIG. 2A is a perspective view of a metal header for a laser diode in accordance with the present invention.
Figure 2B:
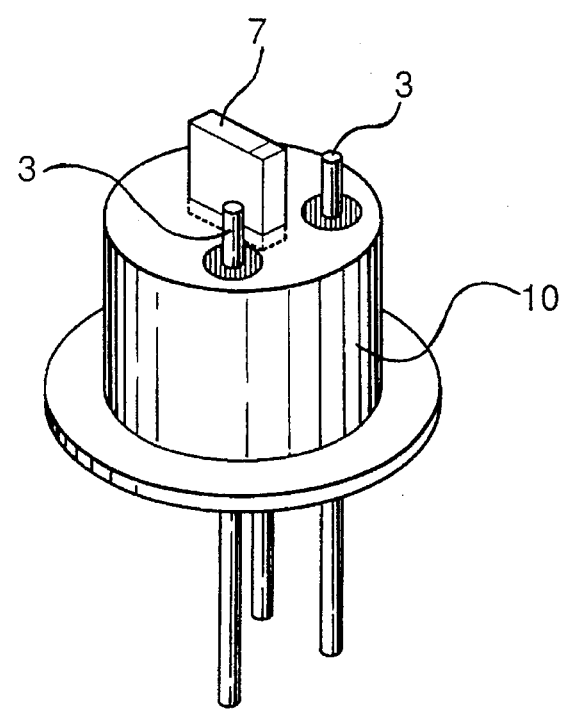
FIG. 2B is a perspective view of the metal header of FIG. 2A to which elements are assembled.

Referring to FIGS. 2A and 2B, a second embodiment of the metal casing for a semiconductor device in accordance with the present invention will be explained. In FIG. 2A, there is shown a metal header for a laser diode for optical communication which is one embodiment of the metal casing in accordance with the present invention.

The metal header shown in FIG. 2A comprises a base member 10 formed of an alloy including copper, tungsten and nickel. The base member 10 comprises holes 8 for terminals and a depression 9 for semiconductor device such as a laser diode.

FIG. 2B shows the metal header of FIG. 2A to which some elements and parts are assembled. In FIG. 2B, terminals 3 are inserted into the holes 8 and hermetically fixed by sealing glass. A semiconductor device 7 is disposed in the depression 9.

The metal header is formed of an alloy including copper, nickel and tungsten or an alloy including copper, nickel and molybdenum or an alloy including copper, nickel, tungsten and molybdenum having high thermal conductivity and a thermal expansion coefficient similar to the ceramic and glass. The alloy has a content of 20 to 50 percent by volume of copper and equal to or less than 1 percent by weight of nickel and the remainder is tungsten and/or molybdenum. A ratio between tungsten and molybdenum can be arbitrarily selected.

According to the present invention, the metal header can be manufactured without costly and troublesome machinery. Namely, a net-shape metal header having the holes and depressions can be obtained.

The process for manufacturing the metal header in accordance with the present invention is identical with the process described in Embodiment 1, so that repetitive explanations are abbreviated in this Embodiment.

EMBODIMENT 3

Figure 3A:
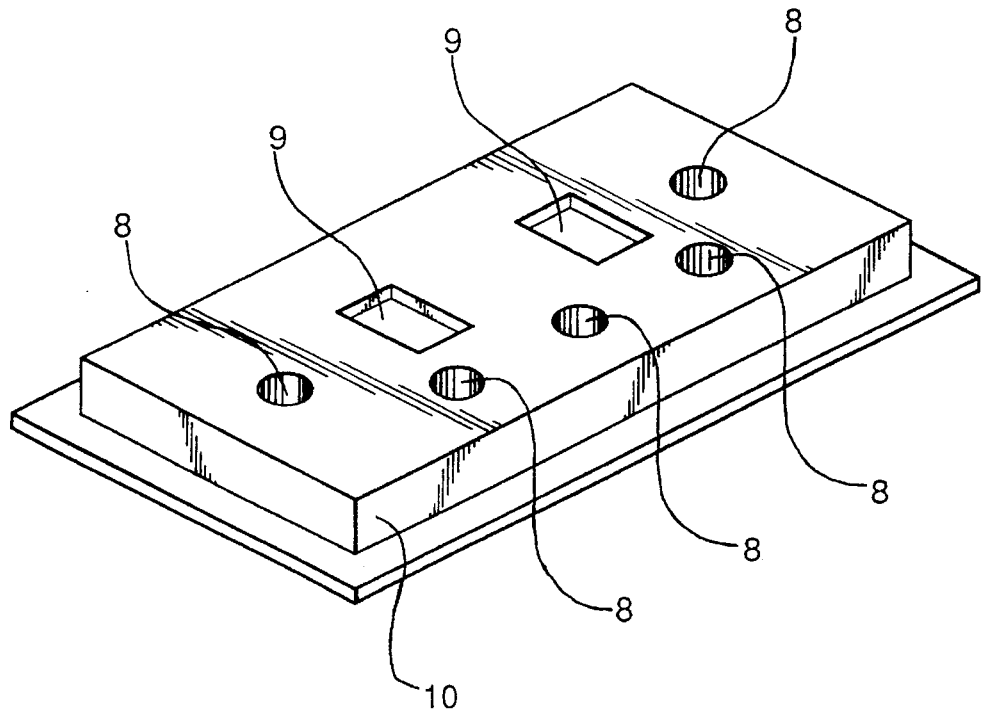
FIG. 3A is a perspective view of a metal header for microwave devices in accordance with the present invention.
Figure 3B:
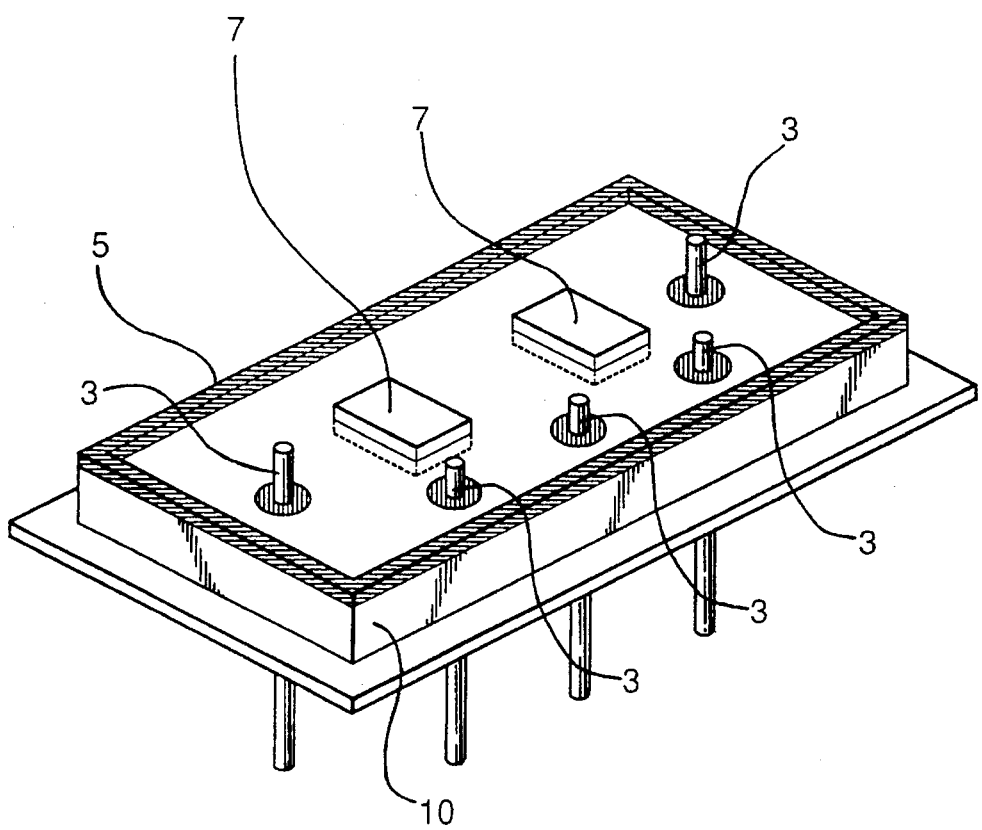
FIG. 3B is a perspective view of the metal header of FIG. 2A to which elements are assembled.

Referring to FIGS. 3A and 3B, a third embodiment of the metal casing for a semiconductor device in accordance with the present invention will be explained. In FIG. 3A, there is shown a metal header for microwave devices which is one embodiment of the metal casing in accordance with the present invention.

The metal header shown in FIG. 3A comprises a base member 10 formed of an alloy including copper, tungsten and nickel. The base member 10 comprises holes 8 for terminals and depressions 9 for semiconductor devices such as microwave devices.

FIG. 2B shows the metal header of FIG. 2A to which some elements and parts are assembled. In FIG. 2B, terminals 3 are inserted into the holes 8 and hermetically fixed by sealing glass. Semiconductor devices 7 are disposed in the depressions 9. A frame 5 for a sealing cap (not shown) is disposed on an edge of the base member 10.

The metal header is formed of an alloy including copper, nickel and tungsten or an alloy including copper, nickel and molybdenum or an alloy including copper, nickel, tungsten and molybdenum having high thermal conductivity and a thermal expansion coefficient similar to the ceramic and glass. The alloy has a content of 20 to 50 percent by volume of copper and equal to or less than 1 percent by weight of nickel and the remainder is tungsten and/or molybdenum. A ratio between tungsten and molybdenum can be arbitrarily selected.

According to the present invention, the metal header can be manufactured without costly and troublesome machinery. Namely, a net-shape metal header having the holes and depressions can be obtained.

The process for manufacturing the metal header in accordance with the present invention is identical with the process described in Embodiment 1, so that repetitive explanations are abbreviated in this Embodiment.

The invention has thus been shown and described with reference to the specific embodiments. However, it should be noted that the present invention is in no way limited to the details of the illustrated structures but changes and modifications may be made within the scope of the appended claims.

We claim:

1. A powder metallurgy injection molding process using infiltration to manufacture net-shape products comprising the steps of mixing tungsten powder and nickel powder having average particle sizes equal to or less than 40 μm so as to form mixed metal powder, kneading the mixed metal powder with an organic binder so as to form an admixture, injection molding said admixture so as to form a predetermined green shape, debinderizing said green shape, applying surface powder to at least one surface of the green shape so as to prevent effusion of copper during infiltration, and infiltrating copper into the green shape so as to produce a net-shape product.

2. A process as claimed in claim 1, wherein molybdenum powder is mixed with the tungsten powder and the nickel powder to form said mixed metal powder.

3. A process as claimed in claim 1, wherein a nickel content of the mixed metal powder is equal to or less than 1 percent by weight.

4. A process as claimed in claim 1, wherein the green shape has porosity of 20 to 50 percent by volume after debinderizing.

5. A process as claimed in claim 1, wherein the step of debinderizing includes a first stage in which the green shape is debinderized by using a vapor of an organic solvent and a second stage in which the green shape is heated to a temperature of equal to or higher than 500° C.

6. A process as claimed in claim 1, further comprising the step of selecting from a material group consisting of $Al_2O_3$, $TiO_2$, $SiO_2$, $ZrO_2$, AlN, BN, $Si_3N_4$, TiN, ZrN, SiC, ZrC, and TiC as a material for said surface powder.

7. A powder metallurgy injection molding process using infiltration to manufacture net-shape products comprising the steps of mixing molybdenum powder and nickel powder having average particle sizes equal to or less than 40 μm so as to form mixed metal powder, kneading the mixed metal powder with an organic binder so as to form an admixture, injection molding said admixture so as to form a predetermined green shape, debinderizing said green shape, applying surface powder to at least one surface of the green shape so as to prevent effusion of copper during infiltration, and infiltration copper into the green shape so as to produce a net-shape product.

8. A process as claimed in claim 7, further comprising the step of selecting from a material group consisting of $Al_2O_3$, $TiO_2$, $SiO_2$, $ZrO_2$, AlN, BN, $Si_3N_4$, TiN, ZrN, SiC, ZrC, and TiC as a material for said surface powder.

9. A powder metallurgy injection molding process using infiltration to manufacture net-shape products comprising the steps of mixing tungsten-molybdenum alloy powder and nickel powder having average particle sizes equal to or less than 40 μm so as to form mixed metal powder, kneading the mixed metal powder with an organic binder so as to form an admixture, injection molding said admixture so as to form an predetermined green shape, debinderizing said green shape, applying surface powder to at least one surface of the green shape so as to prevent effusion of copper during infiltration and infiltrating copper into the green shape so as to produce a net-shape product.

10. A process as claimed in claim 9, further comprising the step of selecting from a material group consisting of $Al_2O_3$, $TiO_2$, $SiO_2$, $ZrO_2$, AlN, BN, $Si_3N_4$, TiN, ZrN, SiC, ZrC, and TiC as a material for said surface powder.

* * * * *